United States Patent [19]

Usuba et al.

[11] 4,328,490
[45] May 4, 1982

[54] LIQUID CRYSTAL DISPLAY DEVICE WITH LOW BATTERY INDICATION

[75] Inventors: Takahiro Usuba; Kazuhiro Iinuma; Soichi Suzuki; Yukito Abe, all of Yokohama, Japan

[73] Assignee: Tokyo Shibaura Denki Kabushiki Kaisha, Japan

[21] Appl. No.: 140,878

[22] Filed: Apr. 16, 1980

[30] Foreign Application Priority Data

Jun. 29, 1979 [JP] Japan .................................. 54/82148

[51] Int. Cl.³ .............................................. G08B 5/36
[52] U.S. Cl. ..................................... 340/715; 340/636;
340/765; 340/811; 350/332
[58] Field of Search ............... 340/636, 706, 715, 756, 340/765; 350/332

[56] References Cited

U.S. PATENT DOCUMENTS

| 3,738,099 | 6/1973 | Tanaka | 340/765 X |
| 3,991,552 | 11/1976 | Ho et al. | 340/765 X |
| 3,991,553 | 11/1976 | Bergey et al. | 340/636 X |
| 4,163,935 | 8/1979 | Sakurada et al. | 340/706 X |

FOREIGN PATENT DOCUMENTS

| 2163684 | 6/1973 | Fed. Rep. of Germany . |
| 2421324 | 11/1974 | Fed. Rep. of Germany . |
| 53-11200 | 4/1978 | Japan . |

*Primary Examiner*—David L. Trafton
*Attorney, Agent, or Firm*—Finnegan, Henderson, Farabow, Garrett & Dunner

[57] ABSTRACT

A liquid crystal display device comprises a liquid crystal display unit including a numeral display section and a unit display section, a dynamic driving circuit connected to said liquid crystal display unit to dynamically drive said numeral display section and a static driving circuit connected to said liquid crystal display unit to statically drive said unit display section, wherein numeral information and unit information are simultaneously displayed on said liquid crystal display unit and wherein the difference in contrast levels between the dynamically driven section and the statically driven section indicates when the battery needs replacing.

6 Claims, 6 Drawing Figures

LIQUID CRYSTAL DISPLAY DEVICE WITH LOW BATTERY INDICATION

BACKGROUND OF THE INVENTION

This invention relates to a liquid crystal display device of battery drive type.

Liquid crystal display devices are widely used in the display section of desk computers and various measuring instruments. For example, a liquid crystal display device is used in a digital electronic thermometer which senses the body temperature by a temperature sensor such as a thermistor and converts the output of the sensor into a corresponding digital signal to display the body temperature. In this case, the liquid crystal device is employed for the purpose of reducing the power consumption in display section of the battery used as driving power source for the digital electronic thermometer.

In the digital electronic thermometer of this kind, unlike desk computers or the like which deal with only digital quantities, the body temperature, which is an analog quantity, is detected by a temperature sensor, and the detected analog quantity is converted in an operation circuit into a digital quantity for displaying the measured body temperature in the digital form. In this case, if the output voltage of a power supply battery employed is reduced to a certain extent, the analog-digital conversion in the operation circuit can be erroneously affected although the display device operates normally. This results in an erroneous measurement information display on the display section. Accordingly, it is necessary to inform the user that the electromotive force of the power supply battery is reduced lower than a predetermined value and also the appropriate time when the battery has to be replaced. With the reduction of the battery voltage, the difference in brightness between the liquid crystal display portion and the background portion of the display portion, that is, the contrast between these portions, is reduced, and hitherto it has been in practice to replace the battery when the displayed content can no longer be clearly seen. However, the contrast between the liquid crystal display section and surrounding portion is greatly influenced by the angle at which the display section is observed, and therefore, with the above method it is difficult to determine the accurate time when the battery has to be replaced.

SUMMRY OF THE INVENTION

An object of the invention is to provide a liquid crystal display device, for which the driving capability of the power supply battery can be known from the state of display of the displayed information.

One preferred form of the invention is a liquid crystal display device driven by a battery comprising liquid crystal display means including first and second display sections, first driving means coupled to the liquid crystal display means to dynamically drive said first display section and second driving means coupled to said liquid crystal display means to statically drive said second display section, the contrast of the second display section noticeably exceeding the contrast of the first display section when the voltage of the battery is below a known level.

DETAILED DESCRIPTION OF THE PREFERRED EMBODIMENT

Now, an embodiment of the liquid crystal display system according to the invention will be described with reference to the accompanying drawings.

Figure 1:
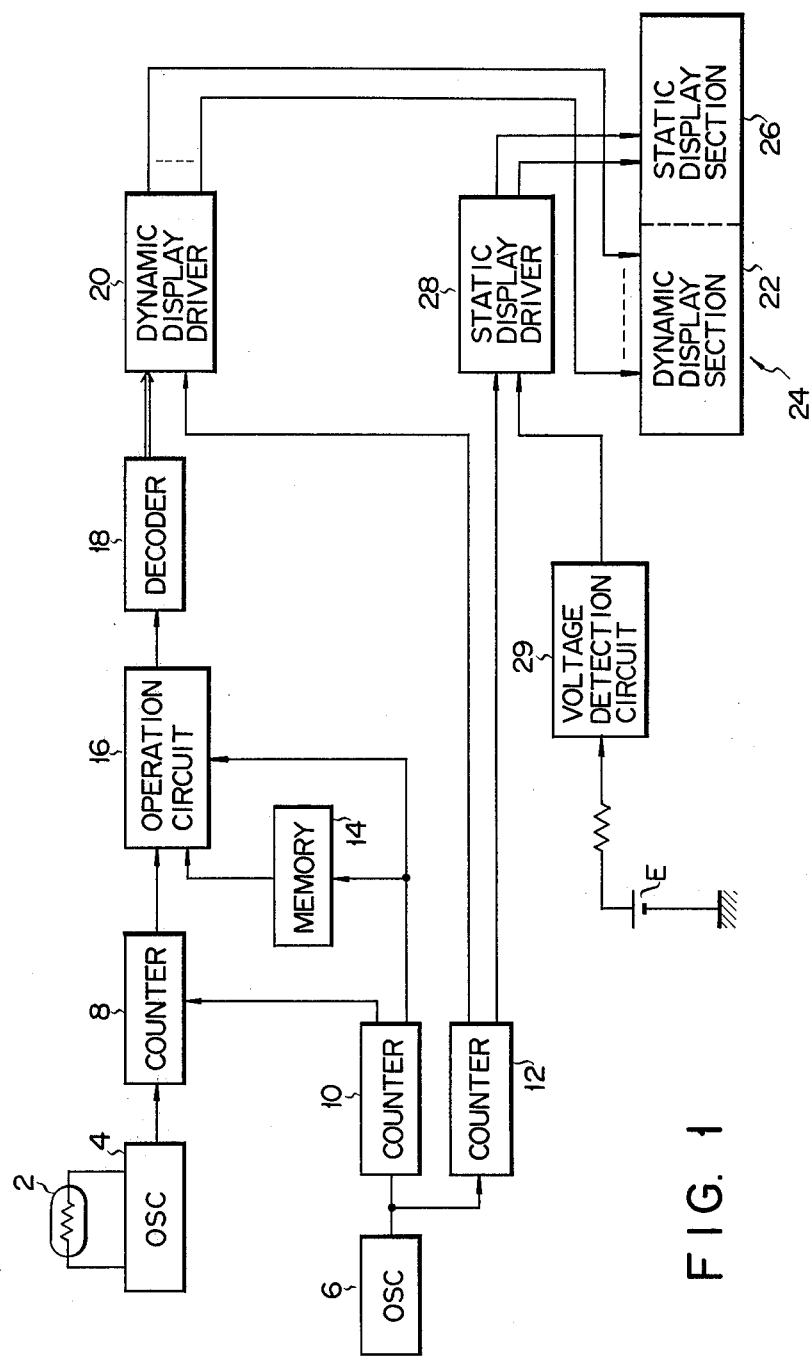
FIG. 1 is a circuit diagram showing an electronic thermometer incorporating a liquid crystal display device embodying the invention.

FIG. 1 shows an electronic thermometer circuit including a liquid crystal display system according to the invention. This electronic thermometer circuit includes a thermistor 2, an oscillating circuit 4 whose output pulse frequency varies with changes in the resistance of the thermistor, and a reference oscillator 6 producing reference pulse signal. The output terminal of the oscillator 4 is connected to a counter 8, and the output terminal of the oscillator 6 is connected to counters 10 and 12. The counter 10 has a first output terminal for controlling the operating state of the counter 8 and a second output terminal. An output signal at the second output terminal of the counter 10 is used to set a memory 14 for storing reference temperature information into a reading mode and also to set an operation circuit 16 into an arithmetic operation mode.

The operation circuit 10 performs calculations on the basis of the contents of the counter 8 and memory 14 to produce a digital signal corresponding to the temperature of the atmosphere surrounding the thermistor 2. The digital output signal from the operation circuit 16 is converted in a decoder 18 into a digital display signal and then supplied to a dynamic display driver 20.

The dynamic display driver 20 drives a dynamic display section 22 of a liquid crystal display unit 24 in response to the first output pulse signal of the counter 12 an in accordance with a digital display signal from the decoder 18.

The liquid crystal display unit 24 is also provided with a static display section 26 driven by a static display driver 28 in response to a second output pulse signal of the counter 12. Coupled to the static display driver 28 is a voltage detection circuit 29, which detects the output voltage of a power supply battery E and periodically produces a high level output signal when the output voltage becomes lower than a predetermined value.

The display drivers 20 and 28 and the liquid crystal display unit 24 constitute the liquid crystal display system embodying the invention. The battery E is coupled to various circuit sections for driving these circuit sections, but for simplifying the drawing the connection between the battery E and the circuit sections are omitted.

Figure 2:
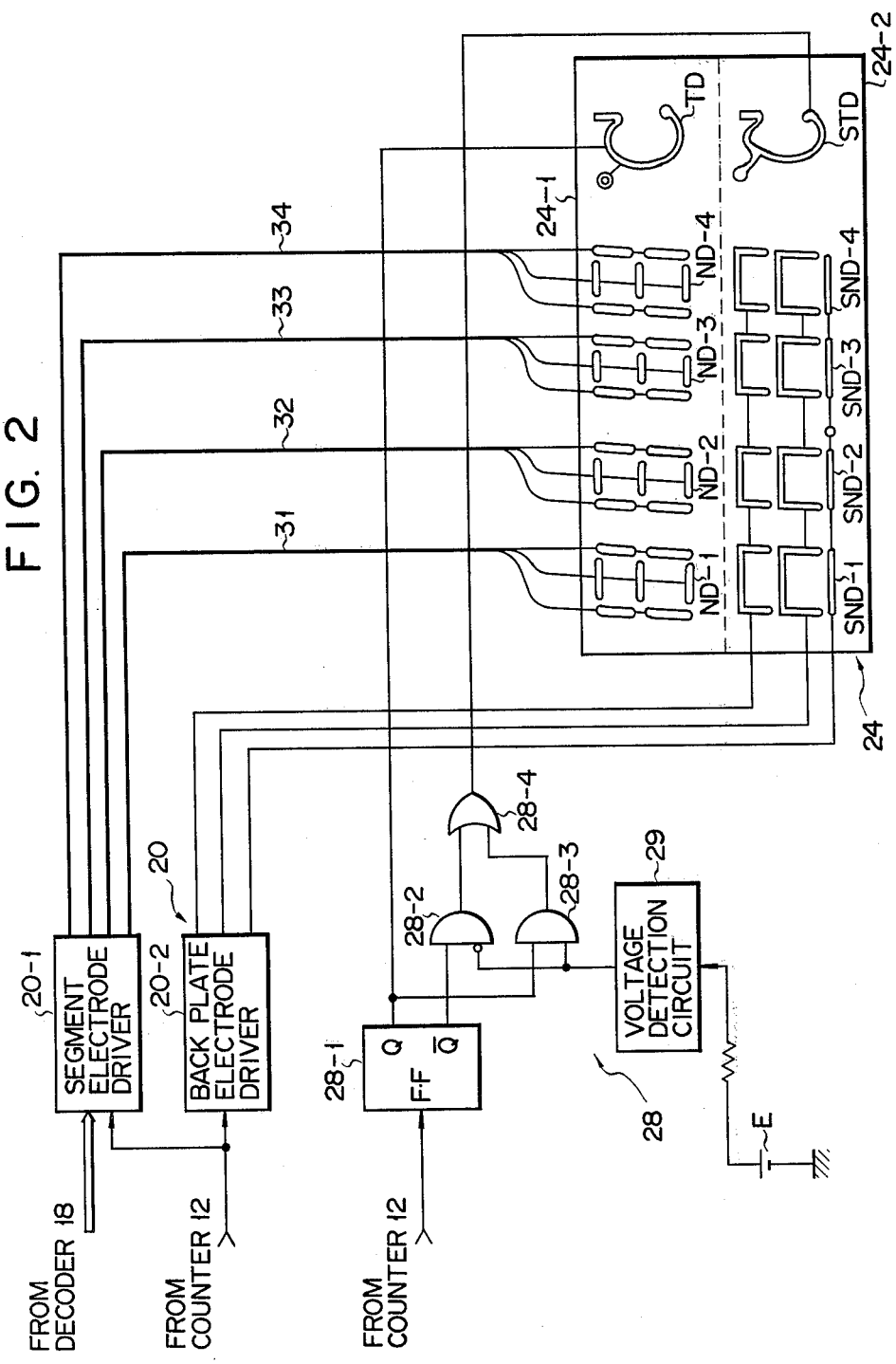
FIG. 2 is a detailed schematic representation of certain elements of the liquid crystal display device shown in FIG. 1.

FIG. 2 shows the display drivers 20 and 28 and liquid crystal display unit 24 in detail. The liquid crystal display unit 24 has front and back electrode plates 24-1 and 24-2. The front electrode plate 24-1 has four digit numeral display elements ND-1 to ND-4 each formed of seven segment electrodes arranged in the form of a figure "8" as most clearly shown in FIG. 3 and a temperature unit display element TD representing a mark "°C", and the back electrode 24-2 has four digit sub-numeral display elements SND-1 to SND-4 each formed of three back plate segment electrodes BP-1 and BP-3 arranged in the form of figure "8" as most clearly shown in FIG. 4 and a sub-temperature unit display element STD representing a mark "°C".

Figure 3:
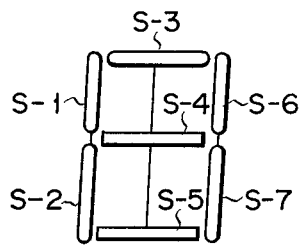
FIGS. 3 and 4 are views showing the arrangement of segment electrodes constituting a numeral display element and that of corresponding back plate electrodes in the display unit shown in FIG. 2.
Figure 4:
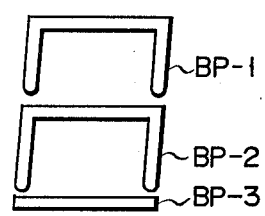

In FIG. 3, the segment electrodes S-1 and S-2 are coupled together, the segment electrodes S-3 to S-5 are coupled together, and the segment electrodes S-6 and S-7 are coupled together.

The front and back electrode plates 24-1 and 24-2 are so arranged that a liquid crystal plate (not shown) is sandwiched between them to display numerals according to the voltages selectively applied to the segment electrodes S-1 to S-7 and back plates BP-1 and BP-3.

The dynamic display driver 20 includes a segment electrode driver 20-1 and a back plate electrode driver 20-2. The segment electrode driver 20-1 includes four output cables 31 to 34 coupled to the respective numeral display elements ND-1 to ND-4, and each cable has a first output line commonly connected to the segments S-1 and S-2 of each numeral display element, a second output line commonly connected to the segments S-3 to S-5 and a third output line commonly connected to the segments S-6 and S-7. The back plate electrode driver 20-2 has three output lines commonly connected to the respective back plate electrodes BP-1, BP-2 and BP-3 of the sub-numeral display elements SNd-1 to SND-4.

The static display driver 28 includes a flip-flop circuit 28-1 having the Q output terminal connected to the temperature unit display element TD, AND gates 28-2 and 28-3 each having one input terminal connected to the Q and Q̄ output terminals of the flip-flop circuit 28-1 and an OR gate 28-4 having input terminals respectively connected to the output terminals of the AND gates 28-2 and 28-3 and an output terminal connected to the sub-temperature unit display element STD. The output signal of the voltage detection circuit 29 is supplied to the other input terminal of the AND gate 28-3, and is also supplied after inversion to the other input terminal of the AND gate 28-2.

Now, the operation of the electronic thermometer circuit shown in FIGS. 1 and 2 will be described.

The oscillator 4 is oscillating at a frequency corresponding to the resistance of the thermistor 2, and the oscillator 6 is oscillating at a reference frequency. The counter 10, which counts output pulses from the oscillator 6, supplies a high level output signal to the counter 8 through the first output line when its count is between C1 and C2. As a result, the counter 8 is set into a counting mode for counting outut pulses from the oscillator 4. When the content of the counter 10 reaches C2, counter 8 stops counting operation to hold the prevailing count.

When the content of the counter 10 is between C2 and C3, it produces a high level output signal from the second output terminal for rendering the memory 14 into a reading mode and for setting the operation circuit 16 into the operating mode. As a result, the operation circuit 16 effects calculations based on the count data of the counter 8 and the reference temperature data from the memory 14 and produces a temperature display signal representing the temperature of the atmosphere surrounding the thermistor 2.

The decoder 18 supplies digital data which corresponds to the temperature display signal from the operation circuit 16 to the dynamic display driver 20.

The segment electrode driver 20-1 of the dynamic display driver 20 receives the digital data from the decoder 18 and the first output pulse signal from the counter 12, which forms the first output signal by dividing the frequency of the pulse output of the oscillator 6. Segment electrode driver 20-1 supplies the segment electrode driving signals corresponding to the digital data from the decoder 18 through the cables 31 to 34 to the numeral display elements ND-1 to ND-4. Driver 20-1's timing is determined by the first output pulse signal of the counter 12.

Meanwhile, the back plate electrode driver 20-2 successively and repeatedly energizes the back plate electrodes BP-1 to BP-3 of the sub-numeral display elements SND-1 to SND-4 with a timing determined by the first output pulse signal of the counter 12. Based on the energization states of the segments S-1 to S-7 of the numeral display elements ND-1 to ND-4 and the energization states of the back plate electrodes of the sub-numeral display elements SND-1 to SND-4, a four digit numeral corresponding to the temperature display signal from the decoder 18 is displayed on the dynamic display section 22.

The output state of the flip-flop circuit 28-1 of the static display driver 28 is switched according to the second output pulse signal of the counter 12. When no high level output signal is produced from the voltage detection circuit 29, that is, when the output voltage from the power supply battery E is sufficiently high, the Q̄ output signal of the flip-flop circuit 28-1 is supplied through the AND gate 28-2 and OR gate 28-4 to the sub-temperature unit display element STD. Meanwhile, the Q output signal is supplied from the flip-flop circuit 28-1 to the temperature unit display element TD, so that the mark "°C" is displayed on the static display section 26.

When the output voltage of the power source battery E becomes lower than a predetermined value, a high level output signal is periodically produced from the voltage detection circuit 29. With the high level output signal from the voltage detection circuit 29, the AND gate 28-3 is enabled and therefore the Q output signal of the flip-flop circuit 28-1 is supplied through the AND gate 28-3 and OR gate 28-4 to the sub-temperature unit display element STD. This means that in-phase driving signals are supplied to the display elements TD and STD, so that the mark "°C" is not displayed in the static display section 26. Thus, while the high level output signal is periodically supplied from the voltage detection circuit 29, the mark "°C" is repeatedly turned on and off in the static display section 26, so that the user can readily recognize that it is time to replace the battery.

Figure 5:
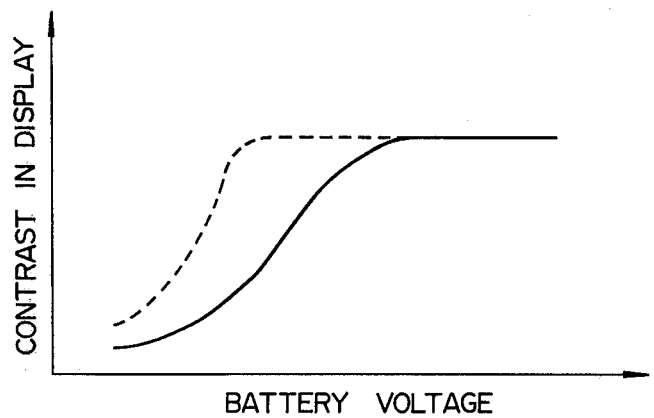
FIG. 5 is a graph showing the relation between the difference in brightness between a dynamic display section and a static display section in the liquid crystal display unit shown in FIG. 2 and the output voltage of the power supply battery.
Figure 6:
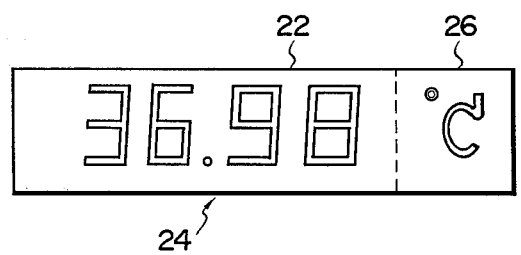
FIG. 6 is a view showing a display state of the liquid crystal display unit which includes a battery state display section.

FIG. 5 shows the relation between the driving voltage and the difference in brightness or contrast between the display portion and the background portion of the display portion, which is obtained when the dynamic display section 22 and static display section 26 are driven by the same driving voltage. In the Figure, the solid line shows the contrast in the dynamic display section, and the broken line shows the contrast in the static display section. As is clearly shown in FIG. 5, when the output voltage of the power supply battery is sufficiently high, the contrast in the dynamic display section 22 is substantially the same as that in the static display section 26, and a difference in the contrast is produced when the output voltage becomes lower than a predetermined value. Thus, whether the power supply battery is still effective or not can be readily confirmed from the observation of the contrast of, for instance, a numeral "36.98" displayed on the dynamic display section 22 and the mark "°C" displayed on the static display section 26, as shown in FIG. 6.

While the invention has been described in connection with an embodiment thereof, this embodiment is not limited thereto.

For example, while the liquid crystal display device of FIG. 1 according to the invention is assembled in an electronic thermometer, it may also be assembled in other measuring instruments, for instance, an instrument for measuring pressure or weight which uses not a thermistor, but a piezoelectric element. Of course, in some cases, it is possible to change the number of the numeral digits in the dynamic display section 22 and also change the unit mark in the static display section 26.

Further, in the embodiment described above, when the output volage of the battery cell becomes lower than a predetermined value, the voltage detection circuit 29 is designed to repeatedly produce a high level output signal. However, it is also possible to continuously produce a high level output signal from the voltage detection circuit 29 when detecting that the battery voltage E becomes lower than the predetermined value so as to keep the mark "°C" de-energized.

What we claim is:

1. A liquid crystal display device powered by a battery comprising:
   liquid crystal display means including first and second display sections;
   first driving means powered by said battery and coupled to said liquid crystal display means to dynamically drive said first display section; and
   second driving means powered by said battery and coupled to said liquid crystal display means to statically drive said second display section, whereby the contrast of said second display section noticeably exceeds the contrast of said first display section when the voltage of said battery is below a known level.

2. A liquid crystal display device according to claim 1, wherein said first display section in said liquid crystal display means has a plurality of numeral display elements, and said second display section has a unit display element.

3. A liquid crystal display device powered by a battery comprising:
   a battery voltage terminal;
   liquid crystal display means including first and second display sections;
   first driving means powered by said battery and coupled to said liquid crystal display means to dynamically drive said first display section;
   second display means powered by said battery and coupled to said liquid crystal display means to statically drive said second display section, whereby the contrast of said second display section noticeably exceeds the contrast of said first display section when the voltage of said battery is below a known level; and
   control means connected to said battery voltage terminal to supply a control signal to said second driving means when detecting that the battery voltage supplied thereto through said battery voltage terminal becomes lower than a predetermined value, thereby changing the display state of said second display section.

4. A liquid crystal display device according to claim 3 wherein said second display means contains means operating in response to said control signal for periodically deactivating said second display section.

5. A liquid crystal display device according to claim 3 wherein said second display means contains means operating in response to said control signal for deactivating said second display section.

6. A liquid crystal display device according to any one of claims 3, 4 or 5 wherein said first display section has a plurality of numeral display elements and said second display section has a unit display section.

* * * * *